(12) United States Patent
Xu et al.

(10) Patent No.: US 12,068,135 B2
(45) Date of Patent: Aug. 20, 2024

(54) FAST GAS EXCHANGE APPARATUS, SYSTEM, AND METHOD

(71) Applicant: Applied Materials, Inc., Santa Clara, CA (US)

(72) Inventors: Ming Xu, San Jose, CA (US); Ashley Mutsuo Okada, San Jose, CA (US); Michael D. Willwerth, Campbell, CA (US); Duc Dang Buckius, San Jose, CA (US); Jeffrey Ludwig, San Jose, CA (US); Aditi Mithun, San Jose, CA (US); Benjamin Schwarz, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 194 days.

(21) Appl. No.: 17/175,216

(22) Filed: Feb. 12, 2021

(65) Prior Publication Data

US 2022/0262600 A1  Aug. 18, 2022

(51) Int. Cl.
*H01J 37/32* (2006.01)
*H01L 21/3065* (2006.01)
*H01L 21/67* (2006.01)

(52) U.S. Cl.
CPC .... *H01J 37/32449* (2013.01); *H01L 21/3065* (2013.01); *H01J 2237/332* (2013.01); *H01J 2237/334* (2013.01)

(58) Field of Classification Search
CPC ............ C23C 16/455; C23C 16/45525; C23C 16/45561; H01L 21/3065; H01L 21/67063;

(Continued)

(56) References Cited

U.S. PATENT DOCUMENTS 4,989,160 A * 1/1991 Garrett .............. H01L 21/67253
　　　　　　　　　　　　　　　　　　　　700/282
5,885,358 A * 3/1999 Maydan ................ C23C 16/455
　　　　　　　　　　　　　　　　　　　　118/723 R (Continued)

FOREIGN PATENT DOCUMENTS

KR  1020080012628 A  2/2008
KR  1020190012033 A  2/2019
WO     2020159791 A   8/2020

OTHER PUBLICATIONS

International Search Report/Written Opinion issued to PCT/US2022/011118 on Apr. 22, 2022.
U.S. Appl. No. 16/396,684, filed Apr. 27, 2019.

*Primary Examiner* — Benjamin Kendall
*Assistant Examiner* — Joshua Reyes
(74) *Attorney, Agent, or Firm* — Patterson + Sheridan, LLP

(57) ABSTRACT

A gas distribution apparatus is provided having a first reservoir with a first upstream end and a first downstream end and a second reservoir with a second upstream end and a second downstream end. A reservoir switch valve is in fluid communication with the first downstream end of the first reservoir and the second downstream end of the second reservoir. The reservoir switch valve operable to selectively couple the first reservoir to an outlet of the reservoir switch valve when in a first state, and couple the second reservoir to the outlet of the reservoir switch valve when in a second state. A plurality of proportional flow control valves are provided having inlets coupled in parallel to the outlet of the reservoir switch valve The plurality of proportional flow control valves have outlets configured to provide gas to a processing chamber.

14 Claims, 3 Drawing Sheets

(58) Field of Classification Search
CPC .......... H01L 21/68714; H01J 2237/332; H01J 2237/334
See application file for complete search history.

(56) References Cited

U.S. PATENT DOCUMENTS

| | | | | |
|---|---|---|---|---|
| 7,104,292 | B2 * | 9/2006 | Wodjenski | F17C 7/00 141/99 |
| 7,279,349 | B2 * | 10/2007 | Sakuma | G02B 6/136 438/31 |
| 7,918,238 | B2 * | 4/2011 | Tanaka | G01F 5/00 700/282 |
| 9,230,815 | B2 * | 1/2016 | Fu | C23C 16/45565 |
| 9,305,810 | B2 | 4/2016 | Singh et al. | |
| 9,605,343 | B2 * | 3/2017 | Winkler | C23C 16/01 |
| 10,179,941 | B1 * | 1/2019 | Khan | H01L 21/67126 |
| 2002/0179148 | A1 * | 12/2002 | Lull | G05D 7/0664 137/487.5 |
| 2002/0198668 | A1 * | 12/2002 | Lull | G05B 13/042 702/50 |
| 2003/0003696 | A1 * | 1/2003 | Gelatos | C23C 16/4405 438/935 |
| 2009/0170332 | A1 * | 7/2009 | Komiyama | F17C 7/00 438/758 |
| 2009/0221149 | A1 * | 9/2009 | Hammond, IV | H01J 37/32449 156/345.33 |
| 2010/0224264 | A1 * | 9/2010 | Homan | H01L 21/2225 137/602 |
| 2013/0252437 | A1 * | 9/2013 | Sano | C23C 16/34 118/704 |
| 2016/0293431 | A1 | 10/2016 | Sriraman et al. | |
| 2017/0009338 | A1 * | 1/2017 | Saito | C23C 16/45523 |
| 2017/0031370 | A1 * | 2/2017 | Drewery | G05D 7/0641 |
| 2017/0275757 | A1 * | 9/2017 | Kikuchi | C23C 16/45561 |
| 2018/0265974 | A1 * | 9/2018 | Okura | H01L 21/28556 |
| 2018/0311700 | A1 * | 11/2018 | Ashizawa | H01L 21/76843 |
| 2019/0078207 | A1 * | 3/2019 | Yagi | C23C 16/14 |
| 2019/0221403 | A1 * | 7/2019 | Myung | H01J 37/32458 |
| 2019/0221427 | A1 * | 7/2019 | Lo | H01J 37/32357 |
| 2019/0332129 | A1 | 10/2019 | Rice et al. | |
| 2019/0333742 | A1 * | 10/2019 | Matsuda | H01L 21/02219 |
| 2020/0027702 | A1 | 1/2020 | Taskar et al. | |
| 2021/0134564 | A1 | 5/2021 | Sawachi et al. | |

* cited by examiner

FAST GAS EXCHANGE APPARATUS, SYSTEM, AND METHOD

BACKGROUND

Field

Embodiments of the present disclosure generally relate to a substrate processing system. In particular, embodiments of the present disclosure relate to a method and apparatus for providing process gas to a substrate processing system.

Description of the Related Art

Semiconductor device formation is commonly conducted in substrate processing platforms containing multiple chambers. In some instances, the purpose of a multi-chamber processing platform or cluster tool is to perform two or more processes on a substrate sequentially in a controlled environment.

During semiconductor device fabrication, stable process gas flows into a processing chamber are desired to provide process uniformity and to minimize processing defects. Generally, the flow rate of the process gas increases up from zero to a steady state condition over time upon opening of a gas delivery valve. In some processes, the duration of gas flow settling to a steady state condition is a significant fraction of the overall during of the gas flow time. In such processes, the comparatively long settling time leads to undesirable processing result. To reduce and in some cases eliminate the settling time, some gas delivery apparatuses maintain a steady state process flow by diverting the full flow into the chamber foreline when flow into the chamber is not required. When required, the full flow quickly switch from the foreline into the processing chamber with little to no settling time, resulting in improved process uniformity and processing results. Although diverting process gas flows between the foreline and processing chamber has proven to be an effective technique for obtaining desired process results, the amount of processing gas utilized is high. Additionally, delivery hardware for providing precursor flows is expensive and often requires a dedicated gas sticks for delivering a process gas to different regions of the processing chamber, such as inner and outer regions of a showerhead. The need for multiple dedicated gas sticks only further exasperates the high amount of gas use.

Accordingly, there is a need for providing process gas to a processing chamber using optimized amount of gas and without the use of multiple dedicated gas sticks.

SUMMARY

In some embodiments, a gas distribution apparatus is provided having a first reservoir with a first upstream end and a first downstream end and a second reservoir with a second upstream end and a second downstream end. A reservoir switch valve is in fluid communication with the first downstream end of the first reservoir and the second downstream end of the second reservoir. The reservoir switch valve operable to selectively couple the first reservoir to an outlet of the reservoir switch valve when in a first state, and couple the second reservoir to the outlet of the reservoir switch valve when in a second state. A plurality of proportional flow control valves are provided having inlets coupled in parallel to the outlet of the reservoir switch valve. The plurality of proportional flow control valves have outlets configured to provide gas to a processing chamber.

In some embodiments, a semiconductor processing system is provided having a process chamber with a process volume for processing a substrate. The process chamber has a first process gas inlet and a second process gas inlet. The system includes a gas distribution assembly with a first reservoir having a first upstream end and a first downstream end and a second reservoir having a second upstream end and a second downstream end. A reservoir switch valve is in fluid communication with the first downstream end of the first reservoir and the second downstream end of the second reservoir. The reservoir switch valve is operable to selectively couple the first reservoir to an outlet of the reservoir switch valve when in a first state, and couple the second reservoir to the outlet of the reservoir switch valve when in a second state. A first and second proportional flow control valves have inlets coupled in parallel to the outlet of the reservoir switch valve, the first proportional flow control valve has an outlet coupled to the first inlet of the processing chamber and the second proportional flow control valve has an outlet coupled to the second inlet of the processing chamber.

In some embodiments, a method is provided for supplying gases to a process volume of a process chamber. The method includes supplying, through a reservoir switch valve situated in a first state, a first process gas to the process volume from a first reservoir. Supplying the first process gas to the process volume includes maintaining a first gas pressure range within the first reservoir and controlling a first process gas flow from the first reservoir to one or more regions of the process volume using a plurality of proportional flow control valves disposed upstream of the process volume. The reservoir switch valve is switched to a second state. A second process gas is supplied to the process volume through the reservoir switch valve situated in the second state. The second process gas is provided from a second reservoir. Supplying the second process gas includes maintaining a second gas pressure range within the second reservoir, and controlling a second process gas flow from the second reservoir to one or more regions of the process volume using the plurality of proportional flow control valves disposed upstream of the process volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure provide a substrate processing system having stable process gas delivery that enhances throughput and improves processing efficiency. One or more embodiments of the present disclosure are described with respect to a plasma etch processing chamber. However, the gas distribution system may be utilized in other types of processing chambers, such as chemical vapor deposition chambers, atomic layer deposition chambers, implant chambers or other processing chamber. In particular, the gas distribution system described herein provides very fast flow stabilization, such that flows may be turned on or switch between gases in a manner that have little to no flow rate settling time, such resulting in a very stable gas delivery that promotes process uniformity and deduction of defects. Moreover, as the very fast flow stabilization also enables faster cycling between gases, allowing greater process windows and variety of processes to be performed. Furthermore, the gas distribution system does not rely on dumping flow flows of process gases into the foreline to enable fast flow stabilization as done in conventional systems, thus advantageously reducing the amount and cost of process gases required to perform cyclical processes, such as trench etching processes. Moreover, the gas distribution system disclosed herein further reduces high process gas-delivery hardware costs by eliminating the need in conventional processing chambers for dedicated gas sticks for delivering a process gases to different processing regions of the processing chamber.

Figure 1:
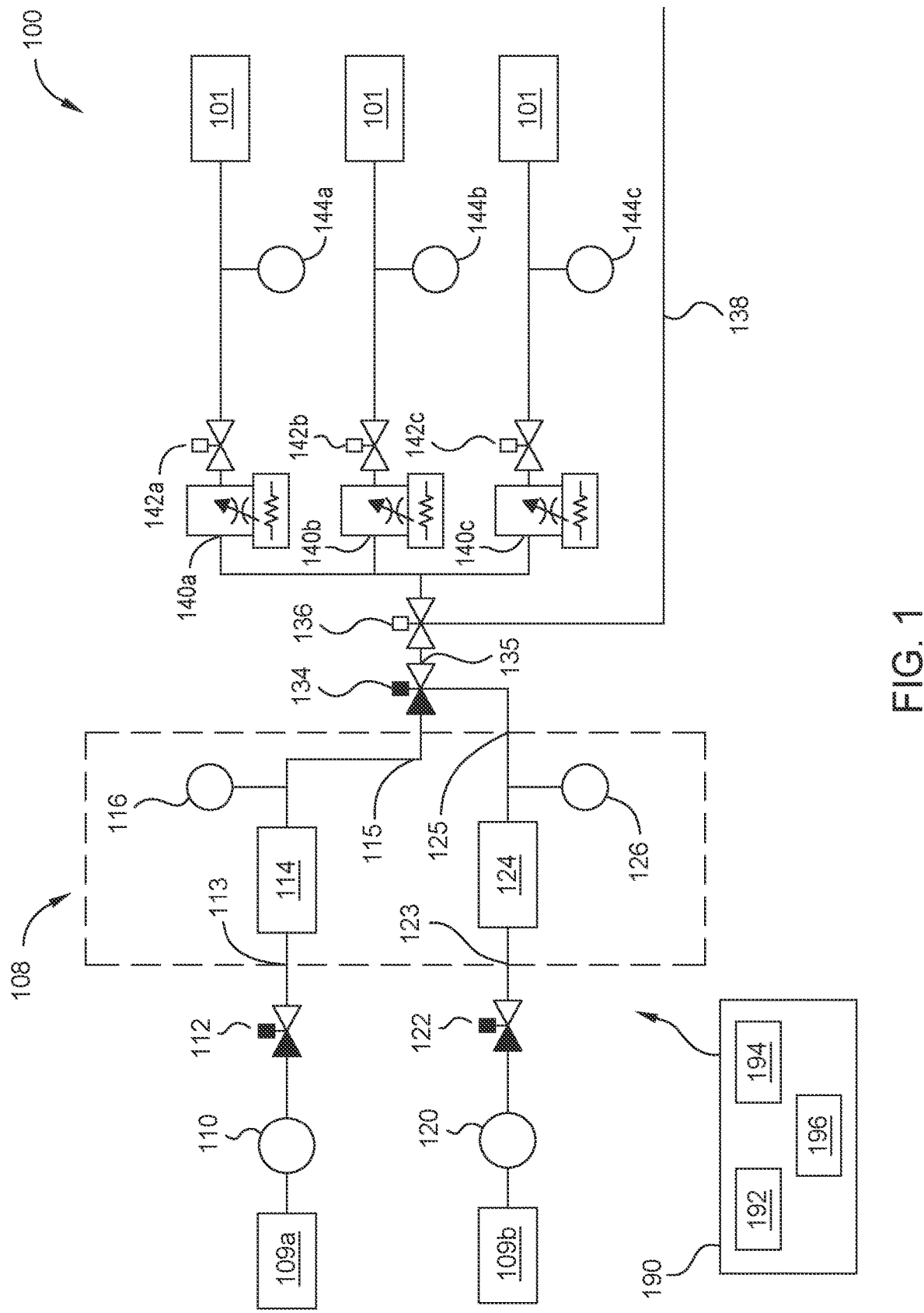
FIG. 1 depicts a schematic representation of a gas distribution system in accordance with embodiments of the present disclosure.
Figure 2:
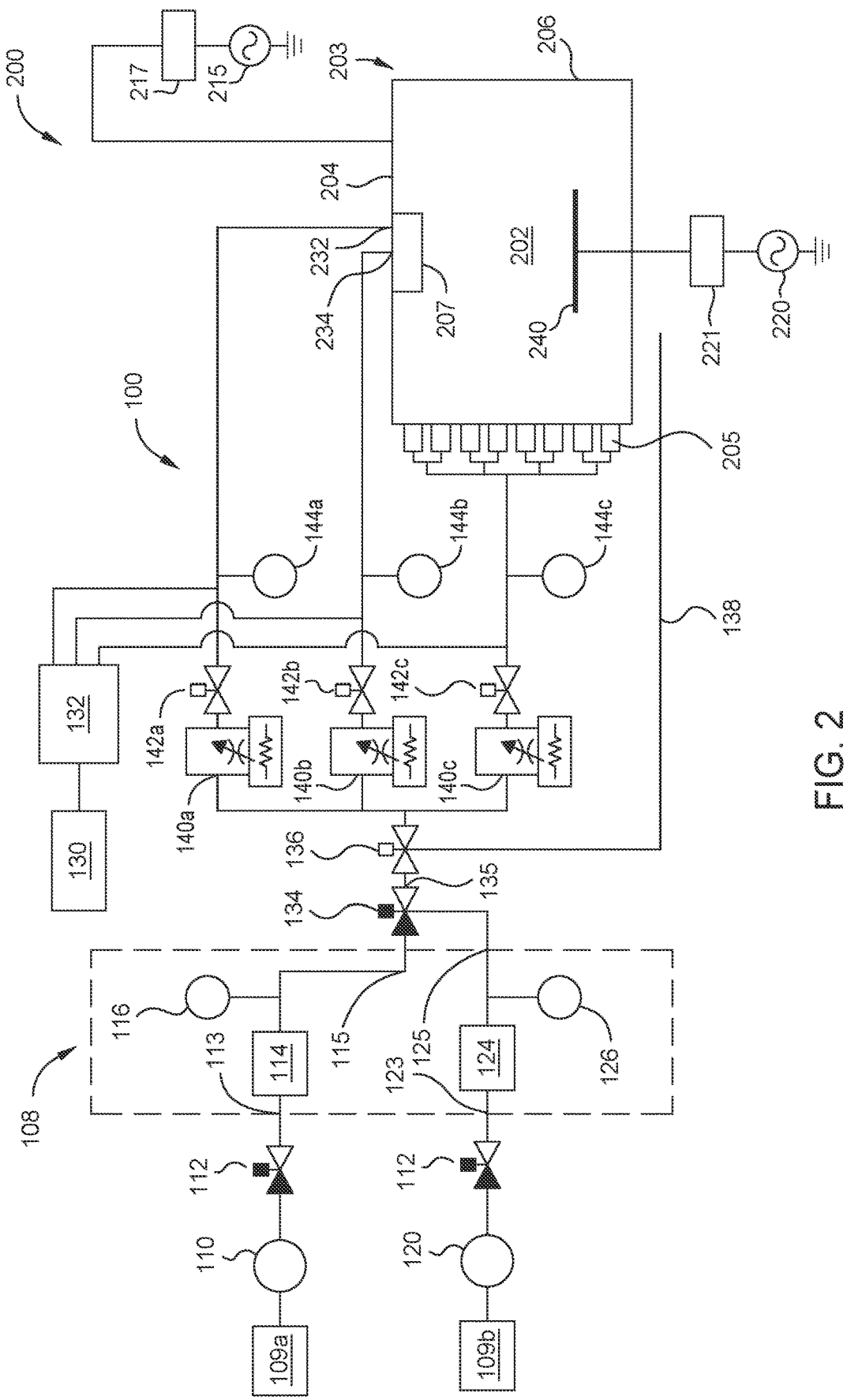
FIG. 2 depicts a schematic representation of a gas distribution system used to distribute gases to multiple regions of a single process chamber.

FIG. 1 depicts a schematic representation of a gas distribution system 100. The gas distribution system 100 includes a common enclosure 108 to distribute gases to multiple process regions 101. The processing regions 101 are separate processing chambers or are separate process regions of a single process chamber. FIG. 2 depicts the gas distribution system used to distribute gases to multiple regions of a single process chamber 203 in accordance with an embodiment. While FIG. 1 illustrates three process regions 101, more or less process regions 101 are also contemplated to be used with the disclosed gas distribution system 100.

The common enclosure 108 includes two or more gas reservoirs (e.g., first gas reservoir 114 and second gas reservoir 124). In some embodiments, which can be combined with other embodiments described herein, the common enclosure is temperature controlled or the common enclosure is not temperature controlled. Although the first and second reservoirs 114, 124 are depicted within a common enclosure 108, the gas distribution system 100 described herein can also include embodiments without a common enclosure 108. In some embodiments, which can be combined with other embodiments described herein, the first and second reservoirs 114, 124 are disposed proximate to and coupled to multiple process regions 101. The first gas reservoir 114 includes a first upstream end 113 and a first downstream end 115. The second gas reservoir 124 includes a second upstream end 123 and a second downstream end 125. A pressure gauge (e.g., first pressure gauge 116 for first reservoir 114, second pressure gauge 126 for second reservoir 124) is coupled to a corresponding reservoir and is capable of measuring the pressure of the corresponding reservoir. In some embodiments, which can be combined with other embodiments described herein, each reservoir includes more than one pressure gauge configured to measure pressure at different points between an upstream end (e.g., 113, 123) and a downstream end (e.g., 115, 125) of each reservoir.

One or more regulators (e.g., first regulator 110 for the first reservoir 114) are coupled to a first upstream end 113 of the first reservoir 114 and a second upstream end 123 of the second reservoir 124 (e.g., second regulator 120 for the second reservoir 124). Each regulator (110, 120) is any suitable gas regulator or any suitable mass flow controller known in the industry. Each regulator provides a supply pressure (or input pressure) to each of the first and second reservoir (114, 124). The regulators can be any mechanical or electrically controlled proportional pressure control component. Each regulator (110, 120) is coupled to a corresponding refill valve which is coupled to a corresponding reservoir (e.g., first refill valve 112 for first reservoir 114, second refill valve 122 for second reservoir 124). Each refill valve 112, 122 is a valve that is either fully open or fully closed to allow gas to flow therethrough or to prevent gas from flowing therethrough. Alternatively, each refill valve 112, 122 is a variable open valve that allows modulation of the flow profile through the valve. Each refill valve 112, 122 is selected from a fast actuating valve, a solenoid valve, and a piezo valve. The refill valve 112, 122 is a fast actuating valve capable of transitioning positions (e.g., open/closed) within 50 milliseconds, such as within 40 milliseconds, or within 30 milliseconds, or from 10 milliseconds to 20 miliseconds. In some embodiments, which can be combined with other embodiments described herein, the refill valve 112, 122 is a pneumatically actuated, normally closed (N.C) fast actuating valve and is configured to engage when a reservoir is within about 90% of a pressure set point and pulse in about 100 ms or less intervals until the pressure within the reservoir is within tolerance. The first regulator 110 and first refill valve 112 is operable to maintain pressure within the first reservoir 114 within a substantially constant pressure, and the second regulator 120 and second refill valve 122 is operable to maintain pressure within the second reservoir 124 within a substantially constant pressure.

The regulators 110, 120 and refill valves 112, 122 are coupled to a first gas source 109a and second gas source 109b through inlet lines. Each process gas from each gas source is used to fill corresponding reservoirs 114, 124 and exit the corresponding reservoirs and flow to a reservoir switch valve 134. The switch valve 134 is one or more valve clusters, such as a 3-way valve configured to switch from a first gas from the first reservoir 114 to a second gas from the second reservoir 124 and release each of the first and second gases in a downstream direction. Although the switch valve 134 is depicted as a 3-way valve in the figures, other embodiments such as one or more valve clusters are contemplated for systems with more than two reservoirs. The reservoir switch valve is in fluid communication with the first downstream end of the first reservoir and the second downstream end of the second reservoir. In operation the reservoir switch valve 134 is operable to selectively couple the first reservoir to an outlet 135 of the reservoir switch valve 134 when in a first state. The reservoir switch valve 134 is operable to selectively couple the second reservoir to the outlet 135 of the reservoir switch valve 134 when in a second state.

Conventional gas distribution assemblies do not use switch valves downstream of distribution lines. Instead, conventional gas distribution assemblies use a plurality of distribution lines from each gas source, each distribution line corresponding to a different process station or process region. Conventional distribution assemblies continuously flow gases that are either diverted to a foreline 138 or to fast pulsing valves that pulse the gas to the process volume. It has been discovered that incorporating a switch valve 134 capable of switching between the first reservoir 114 and the second reservoir 124 minimizes the number of total distribution lines used in a process. Instead, the switch valve 134 alternates between each of the first and second process gases in accordance with a process recipe and flows the gases to a plurality of proportional flow control valves (e.g., 140*a*, 140*b*, 140*c*, etc.). The plurality of proportional flow control valves have inlets coupled in parallel to the outlet of the reservoir switch valve 134.

A diverter valve 136 is disposed between the switch valve 134 and the proportional flow control valves 140*a*, 140*b*, 140*c*. The diverter valve 136 is used to purge gases from each of the reservoirs to the foreline 138. The diverter valve 136 is also operational to direct gas flow to each of the plurality of proportional flow control valves (e.g., 140*a*, 140*b*, 140*c*) to each process region 101. The plurality of proportional flow control valves have inlets coupled in parallel to the outlet of the diverter valve 136.

Each of the proportional flow control valves is coupled to a corresponding process region 101. Each of the plurality of proportional flow control valves (e.g., 140*a*, 140*b*, 140*c*) is capable of splitting gas flow between each of the process regions 101. Each of the plurality of proportional flow control valves (e.g., 140*a*, 140*b*, 140*c*) is piezoelectric flow control valve (e.g., piezo valve) that is electrically actuated. Each of the plurality of proportional flow control valves are coupled to a heater. Downstream of each proportional flow control valve is a normally open solenoid valve (N.O. valves), such as pneumatically actuated valves 142*a*, 142*b*, 142*c*. The pneumatically actuated valves are used to tune gas flow therethrough and used in conjunction with pressure gauges 144*a*, 144*b*, 144*c*.

The gas distribution system 100 includes a controller 190. The controller 190 is coupled to various components of the gas distribution system 100 to control the operation thereof. The controller 190 is a single controller that controls the system, or multiple controllers that control individual portions of the system. In some embodiments, each of the proportional flow control valves are communicatively coupled to the controller 190. The controller 190 controls the flow ratio between the proportional flow control valves 142*a*, 142*b*, 142*c*.

In some embodiments, which can be combined with other embodiments described herein, the controller 190 includes a central processing unit (CPU) 192, a memory 194, and support circuits 196. The controller 190 controls the gas distribution system 100 directly, or via computers (or controllers) associated with particular process chamber and/or support system components. The controller 190 is one or any form of general-purpose computer processor that is used in an industrial setting for controlling various chambers and sub-processors. The memory 194 or computer readable medium of the controller is one or more of readily available memory such as random access memory (RAM), read only memory (ROM), floppy disk, hard dis, optical storage media (e.g., compact disc or digital video disc), flash drive, or any other form of digital storage, local or remote. The support circuits 196 are coupled to the CPU 192 for supporting the processor in a conventional manner. These circuits include cache, power supplies, clock circuits, input/output circuitry and subsystems, and the like. One or more processes are stored in the memory as software routine that is executed or invoked to control the operation of the system or individual components in the manner described herein. The controller 190 includes one or more configurations which include any commands or functions to control flow rates, gas valves, gas sources, or other processes for performing the various configurations.

The controller 190 is connected to one or more of the regulators 110, 120, the refill valves 112, 122, the switch valve 134, the diverter valve 136, the proportional flow control valves 140*a*, 140*b*, 140*c*, or the pneumatically actuated valves 142*a*, 142*b*, 142*c*. The controller 190 has one or more configurations. In some embodiments, which can be combined with other embodiments described herein, the controller 190 has a configuration to open and/or close one or more of the refill valves 112, 122. In some embodiments, which can be combined with other embodiments described herein, the controller 190 has a configuration to monitor pressure using one or more of pressure gauges 116, 126, 144*a*, 144*b*, 144*c*.

Although the gas distribution system 100 is suitable for a number of different processes, one particular use is through silicon via (TSV) etching, which is an application which uses a low frequency bias and a low temperature environment to form deep trenches to a silicon substrate. One type of etching system includes in situ plasma etching in which a trench is formed by alternating the removal and deposition of material on a substrate in a single reactor with a removing plasma and a deposition plasma. Another type of etching system includes remote plasma etching, in which a trench is formed using plasmas generated in a remote reactor prior to being introduced onto the substrate located in the primary reactor (e.g., process chamber 203 shown in FIG. 2). Processing the substrate includes alternating between depositing and etching films on the substrate by supplying a deposition gas and an etching gas in quick succession. Although only two gas sources 109*a*, 109*b* are depicted in FIGS. 1 and 2, alternative or additional gas sources are also contemplated. In this manner, the etch gas is provided to incrementally etch a trench or other feature in a substrate in a series of pulses, while the deposition gas is provided to coat and protect the sidewalls of the trench or other feature being etched in a substrate between etch pulse of etch gas.

FIG. 2 depicts a reactor 200 having a process chamber 203 and a gas distribution system 100 that distributes gases to a plurality of regions within a process volume 202 of the process chamber 203. The process chamber 203 includes a lid 204, a power source 215 and a matching network 217, a bias power 220 and a matching network 221, an electrostatic chuck 240, and a gas distribution system 100. Proportional flow control valves 140*a* and 140*b* of the gas distribution system 100 directs gas to a nozzle assembly 207 coupled to the lid 204 of the process chamber 203. The proportional flow control valve 140*a* is coupled to an edge nozzle of the nozzle assembly 207 via first gas inlet 232 and the edge nozzle directs gas to an edge region of the process volume 202. Proportional flow control valve 140*b* is coupled to a center nozzle of the nozzle assembly 207 via second gas inlet 234 and the center nozzle directs gas to a center region of the process volume 202. The first gas inlet 232 is disposed outward of the second gas inlet 234 relative to a vertical centerline of the processing chamber. Although the figures depict the second inlet at the center of the nozzle assembly 207, other positions are also contemplated, such as offset from the center. The radial position (e.g., from the center line of the nozzle assembly 207) of the second gas inlet 234 is offset from the radial position of the first gas inlet 232. Proportional flow control valve 140*c* directs gas to side nozzles 205 disposed on a side 206 of the process chamber 203. Although three proportional flow control valves are depicted in the figures, more or less proportional flow control valves are contemplated to direct gas to more or less regions with the process volume 202 for customized tuning of gas flow.

The source power 215 for generating and maintaining the plasma processes is coupled to the process chamber 203 via a power generator (not shown) which can be in the form of one or more antennas or coils. The source power 215 is operable to generate a radio frequency within a range from about 12 MHz to about 13.5 MHz, having pulsing capabilities, a power within a range from about 10 watts to about 7500 watts, such as about 300 watts to about 5000 watts, and further includes a dynamic matching network 217. The source power 215 includes a dual tunable source so that the radio frequency is changed during an etching cycle. In some embodiments, which can be combined with other embodiments described herein, the source power 215 includes a remote plasma source capable of generating high levels of plasma disassociation that is mountable on the process chamber 203. The process chamber 203 includes in situ source power, remote plasma source power, or combination of both. In some embodiments, which can be combined with other embodiments described herein, the plasma is generated in a remote plasma source power and transferred to the process chamber 225 and the in situ source power 215 maintains the generated plasma within the process chamber 225. An etching cycle is performed in which the power range of power source 215 may be increased or decreased during the etching cycle and/or pulsed during the etching cycle.

The bias power 220 for biasing the substrate is coupled to the process chamber 225 and the chuck 240. The bias power 220 is operable to generate a radio frequency of about 2 MHz having pulsing capabilities, a low power range of about 10 watts to about 500 watts, and further includes a dynamic matching network 221. The bias power 220 is capable of generating a selectable radio frequency range from about 100 kHz to about 13.56 MHz, having pulsing capabilities, a power range from about 10 watts to about 2000 watts. In some embodiments, which can be combined with other embodiments described herein, an etching cycle includes a deposition operation and an etch operation which are cyclically repeated. Subsequent etch operations of the etching cycle, the radio frequency and/or wattage of the bias power 220 may be increased or decreased from relative to a prior etch operation of the etching system. In one example, the bias power 220 is greater during the etch operation relative to the deposition operation.

Figure 3:
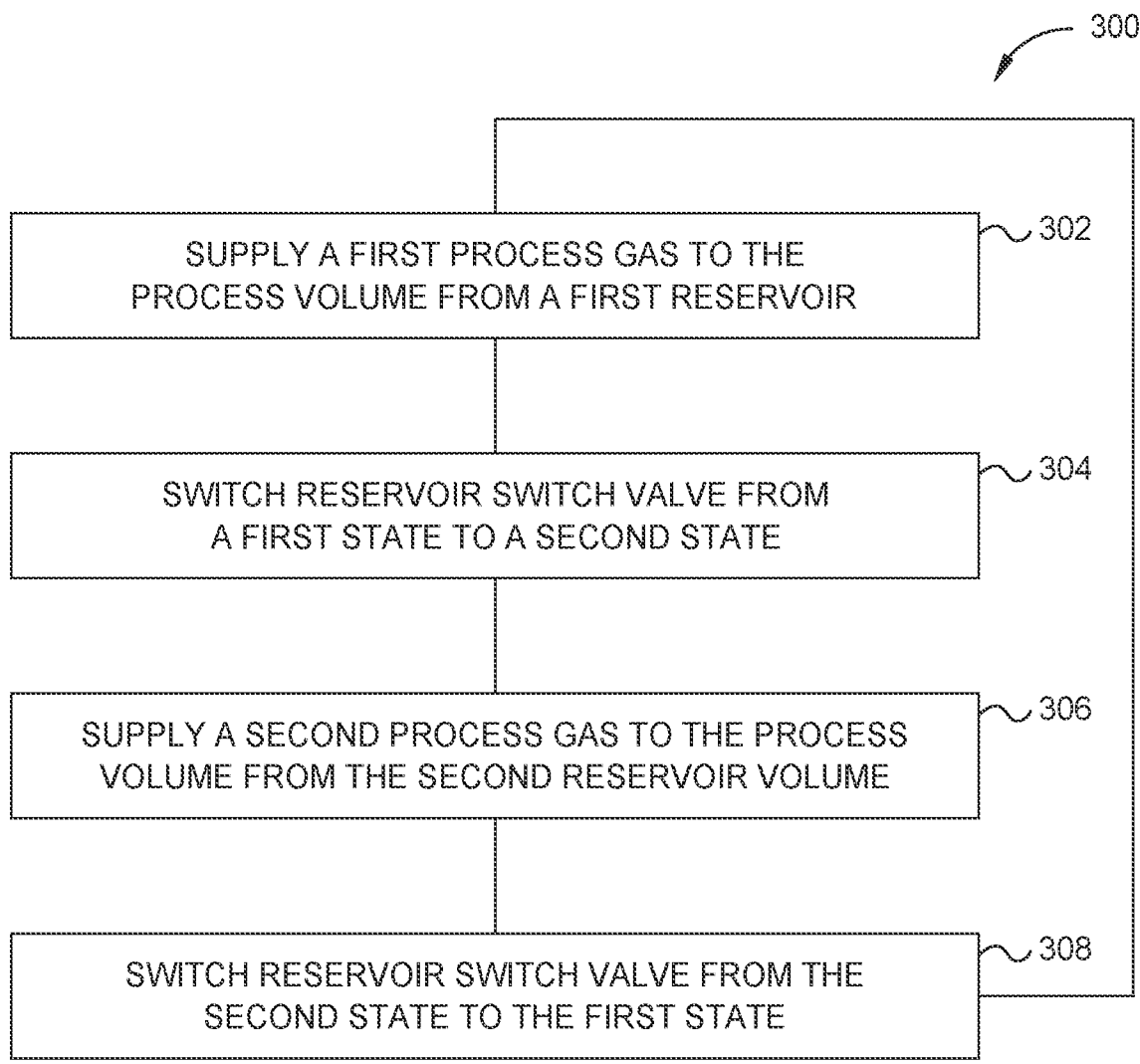
FIG. 3 depicts a flow diagram of a method in accordance with embodiments of the present disclosure.

FIG. 3 depicts a flow diagram of a process 300 for distributing gas in accordance with embodiments of the present disclosure. The method includes, in operation 302, supplying, through a reservoir switch valve situated in a first state, a first process gas, to the process region 101 from a first reservoir 114. The first reservoir 114 is filled using a first gas source 109a and a first gas pressure range is maintained within the first reservoir. The first process gas flow is controlled from the first reservoir to one or more regions of the process volume 202 using a plurality of proportional flow control valves disposed upstream of the process volume 202.

It is also contemplated to couple more than one gas source to the first reservoir 114, such as for etching applications, one or more of oxygen, helium, and argon may be provided in addition to an etchant. In some embodiments, which can be combined with other embodiments described herein, a plasma sustaining gas is provided, such as argon. In some embodiments, which can be combined with other embodiments described herein, the gas distribution assembly is configured for silicon etching, and the first process gas is an etch gas, such as a fluoride containing gas, a sulfur containing gas, or a gas containing one or both of fluoride and sulfur. The first process gas is delivered to the process volume 202 at about 10 sccm to about 3,000 sccm for a predetermined duration. In some embodiments, the first process gas is an etch gas and etches a portion of a feature in a substrate disposed in the process volume 202.

In conventional processes, fast valves and turned on and off at a certain high frequency, such as pulsing, in order to control the amount gases introduced to the process volume 202. In the gas distribution system 100 described herein, proportional flow control valves, such as piezo valves are used instead to control the amount of gas introduced to a particular region of the process volume 202. Thus, the gas distribution system of the present disclosure eliminates the use of valves with pulsing mechanisms. Each proportional flow control valve is controlled by controller 190 and uses a process time of about 0.2 seconds or greater, such as about 0.3 seconds or greater, such as about 1 second to 2 seconds, or about 0.3 seconds to about 0.5 seconds for each process operation.

In operation 304, gas flow is switched from the first reservoir to a second gas from a second reservoir. In particular, the reservoir switch valve 134 is switched from the first state to a second state such that the second gas from the second reservoir flows through the outlet of the reservoir switch valve 134. The switch valve 134 directs gas, to the plurality of proportional flow control valves (140a, 140b, 140c). The plurality of proportional flow control valves are operable to split the gas flow into predetermined ratios therethrough to the process volume 202. A controller 190 is communicatively coupled to the reservoir switch valve 134 and controls synchronized switching of the gases to a predetermined timed sequence of flow controller actuation, such as valve timing control. The controller 190 is communicatively coupled to the plurality of proportional flow control valves 140a, 140b, 140c and to pneumatically actuated valves downstream of the proportional flow control valves for tuning gas flow to each region of the process volume 202. Tuning the gas flow to each region of the process volume 202 enables enhanced processing of the substrate and enhanced processing uniformity. In some embodiments, which can be combined with other embodiments described herein, switching from the first reservoir 114 to the second reservoir 124 occurs substantially simultaneously with opening the first refill valve 112 to refill the partially depleted first reservoir 114. Alternatively, the refill valve 112 is opened when the first pressure gauge 116 reaches a lower pressure of the reservoir and/or closes when the first pressure gauge 116 reaches an upper pressure. In some embodiments, which can be combined with other embodiments described herein, the first and second refill valves are piezo valves used to maintain the pressures of the first and second reservoirs at a predetermined range, such as between about 100 Torr and about 1000 Torr, depending on the process. A similar process control is applicable for the second reservoir for switching from the second reservoir to the first reservoir during processing.

In operation 306, the second process gas is supplied to the process region 101 from the second reservoir 124. The second reservoir 124 is filled using a second gas source 109b. A second gas pressure range is maintained within the second reservoir. The second process gas flow is controlled from the second reservoir to one or more regions of the process volume 202 using a plurality of proportional flow control valves disposed upstream of the process volume 202. It is also contemplated to couple more than one gas source to the second reservoir 124, such as one or more of oxygen, helium, and argon. In some embodiments, which can be combined with other embodiments described herein, the second process gas is a deposition gas, such as polymer deposition gas, for example a fluoride containing gas, a carbon containing gas, or a gas having one or more of fluoride and carbon, such as a fluorocarbon. The second process gas is delivered to the process volume 202 at about 10 sccm to about 3,000 sccm. In some embodiments which can be combined with other embodiments described herein, the second process gas is used to deposit a protective polymer layer on the etched portion of the feature of the substrate (e.g., etched in operation 302). Each proportional flow control valve is controlled by a controller 190 and uses a processes time of about 0.2 seconds or greater, such as about 0.3 seconds or greater, such as about 1 second to 2 seconds, or about 0.3 seconds to about 0.5 seconds for each process operation.

After supplying the second gas to the process volume 202, in operation 308, the reservoir switch valve is switched from the second state to the first state. Thus, the first process gas from the first reservoir is again in fluid communication with the process volume. Operations 302, 304, 306, and 308 are repeated in a predetermined process cycle to form the feature of the substrate by cyclically etching a portion of a feature, depositing a protective polymer layer on the etch portion, then etching another portion of the feature, depositing another polymer layer on the etch portion and so on until a desired depth is etched to form the feature. The gas distribution system 100 described herein is used to switch quickly between gases to process a substrate, such as forming a predetermined profile over a silicon substrate disposed in the process volume 202.

The fast gas exchange assembly described herein is useful with etching systems that employ multi-step processes. The same hardware and operating scheme can also be used in other processes such as atomic layer deposition processes that require gas switching at a fast rate through the process chamber 203.

While the foregoing is directed to embodiments of the present disclosure, other and further embodiments of the disclosure may be devised without departing from the scope thereof, and the scope thereof is determined by the claims that follow.

What is claimed is:

1. A gas distribution apparatus, comprising:
a first reservoir comprising a first upstream end and a first downstream end;
a second reservoir comprising a second upstream end and a second downstream end;
a temperature controlled enclosure containing the first reservoir, the second reservoir, a first pressure gauge, and a second pressure gauge, the first pressure gauge coupled to a first downstream end of the first reservoir, the second pressure gauge coupled to a second downstream end of the second reservoir;
a reservoir switch valve, disposed downstream of the temperature controlled enclosure, in fluid communication with the first downstream end of the first reservoir and the second downstream end of the second reservoir, wherein the reservoir switch valve comprises a first inlet in fluid communication with the first reservoir, a second inlet in fluid communication with the second reservoir, the reservoir switch valve operable to selectively fluidly couple the first inlet to an outlet of the reservoir switch valve when in a first state, and fluidly couple the second inlet to the outlet of the reservoir switch valve when in a second state; and
a plurality of proportional flow control valves having inlets coupled in parallel to the outlet of the reservoir switch valve, the plurality of proportional flow control valves having outlets configured to provide gas to a processing chamber.

2. The gas distribution apparatus of claim 1, further comprising:
a first refill valve and first regulator is coupled to the first upstream end of the first reservoir, the first refill valve and first regulator are operable to maintain pressure within the first reservoir within a substantially constant pressure; and
a second refill valve and second regulator is coupled to the second upstream end of the second reservoir, the second pressure refill valve and second regulator are operable to maintain pressure within the second reservoir within a substantially constant pressure.

3. The gas distribution apparatus of claim 2, wherein the first and second refill valves are selected from the group consisting of solenoid valve, piezo valve, fast actuating valve, and a combination thereof.

4. The gas distribution apparatus of claim 1, wherein each of the plurality of proportional flow control valves are piezo valves.

5. A semiconductor processing system, comprising:
a process chamber comprising a process volume for processing a substrate, the processing chamber having a first process gas inlet and a second process gas inlet
a first gas supply and a second gas supply;
a first regulator disposed downstream of the first gas supply and between a first refill valve and the first gas supply;
a second regulator disposed downstream of the second gas supply and between a second refill valve and the second gas supply; and
a gas distribution assembly downstream of the first gas supply and second gas supply, the gas distribution assembly comprising:
a first reservoir comprising a first upstream end downstream of the first gas supply and a first downstream end, the first upstream end disposed downstream of the first refill valve;
a second reservoir comprising a second upstream end downstream of the second gas supply and a second downstream end, the second upstream end disposed downstream of the second refill valve;
a temperature controlled enclosure containing the first reservoir, the second reservoir, a first pressure gauge, and a second pressure gauge, the first pressure gauge coupled to the first downstream end of the first reservoir, the second pressure gauge coupled to the second downstream end of the second reservoir; and
a reservoir switch valve, disposed downstream of the temperature controlled enclosure, in fluid communication with the first downstream end of the first reservoir and the second downstream end of the second reservoir, wherein the reservoir switch valve comprises a first inlet in fluid communication with the first reservoir, a second inlet in fluid communication with the second reservoir, the reservoir switch valve operable to selectively fluidly couple the first inlet to an outlet of the reservoir switch valve when in a first state, and fluidly couple the second inlet to the outlet of the reservoir switch valve when in a second state; and first and second proportional flow control valves having inlets coupled in parallel to the outlet of the reservoir switch valve, the first proportional flow control valve having an outlet coupled to the first inlet of the processing chamber, the second proportional flow control valve having an outlet coupled to the second inlet of the processing chamber.

6. The semiconductor processing system of claim 5, wherein the first reservoir is in fluid communication with an etching gas source; and wherein the second reservoir is in fluid communication with a deposition gas source.

7. The semiconductor processing system of claim 5, wherein the first process gas inlet is disposed outward of the second process gas inlet relative to a vertical centerline of the processing chamber.

8. The semiconductor processing system of claim 7, further comprising:

a first regulator coupled to the first upstream end of the first reservoir, the first regulator operable to maintain pressure within the first reservoir within a substantially constant pressure; and a second regulator coupled to the second upstream end of the second reservoir, the second regulator operable to maintain pressure within the second reservoir within a substantially constant pressure.

9. The semiconductor processing system of claim 7, wherein the first process gas inlet is configured to provide a first process gas into the processing chamber through a ceiling or showerhead.

10. The semiconductor processing system of claim 7, wherein the first process gas inlet is configured to provide the first process gas into the processing chamber through a sidewall of the processing chamber.

11. The semiconductor processing system of claim 5 further comprising:

a diverter valve disposed between the reservoir switch valve and the first and second proportional flow control valves, the diverter valve comprising:

an inlet connected to the outlet of the reservoir switch valve;

a first outlet connected to the inlets of the first and second proportional flow control valves; and a second outlet connected to a foreline.

12. The semiconductor processing system of claim 5, wherein the first pressure gauge is disposed between the reservoir switch valve and the first reservoir.

13. The semiconductor processing system of claim 5, wherein the first refill valve comprises an open state and a closed state, the first refill valve operable to switch between the open state and the closed state in less than 50 milliseconds.

14. The semiconductor processing system of claim 7, wherein the first process gas inlet is disposed perpendicular to the second process gas inlet.

* * * * *